US011360387B2

(12) United States Patent
Cui et al.

(10) Patent No.: US 11,360,387 B2
(45) Date of Patent: *Jun. 14, 2022

(54) SILICON-CONTAINING UNDERLAYERS

(71) Applicant: Rohm and Haas Electronic Materials LLC, Marlborough, MA (US)

(72) Inventors: Li Cui, Westborough, MA (US); Paul J. LaBeaume, Auburn, MA (US); James F. Cameron, Brookline, MA (US); Charlotte A. Cutler, Hopkinton, MA (US); Shintaro Yamada, Shrewsbury, MA (US); Suzanne M. Coley, Mansfield, MA (US); Iou-Sheng Ke, Andover, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 897 days.

This patent is subject to a terminal disclaimer.

(21) Appl. No.: 16/022,874

(22) Filed: Jun. 29, 2018

(65) Prior Publication Data

US 2019/0041751 A1    Feb. 7, 2019

Related U.S. Application Data

(60) Provisional application No. 62/541,139, filed on Aug. 4, 2017.

(51) Int. Cl.
| | | |
|---|---|---|
| *G03F 7/075* | (2006.01) | |
| *G03F 7/11* | (2006.01) | |
| *C09D 143/04* | (2006.01) | |
| *G03F 7/42* | (2006.01) | |
| *G03F 7/20* | (2006.01) | |
| *G03F 7/09* | (2006.01) | |
| *G03F 7/16* | (2006.01) | |
| *G03F 7/40* | (2006.01) | |
| *G03F 7/32* | (2006.01) | |
| *C08F 220/18* | (2006.01) | |
| *C08F 230/08* | (2006.01) | |

(52) U.S. Cl.
CPC ......... *G03F 7/0752* (2013.01); *C09D 143/04* (2013.01); *G03F 7/094* (2013.01); *G03F 7/11* (2013.01); *G03F 7/162* (2013.01); *G03F 7/168* (2013.01); *G03F 7/2002* (2013.01); *G03F 7/322* (2013.01); *G03F 7/40* (2013.01); *G03F 7/422* (2013.01); *C08F 220/1804* (2020.02); *C08F 230/085* (2020.02); *G03F 7/091* (2013.01)

(58) Field of Classification Search
CPC ......... G03F 7/11; G03F 7/0752; G03F 7/094; G03F 7/162; G03F 7/40; G03F 7/322; G03F 7/422; G03F 7/168; G03F 7/2002; G03F 7/091; G03F 7/16; G03F 7/20; G03F 7/34; G03F 7/2037; G03F 7/42; C09D 143/04; C09D 5/20; C09D 183/04; C08F 220/18; C08F 230/08; C08F 220/1804; C08F 220/06; C08L 83/02
See application file for complete search history.

(56) References Cited

U.S. PATENT DOCUMENTS

| | | | | |
|---|---|---|---|---|
| 4,107,194 | A * | 8/1978 | Malhotra | ................ C08L 27/18 524/440 |
| 5,942,638 | A * | 8/1999 | Lichtenhan | ........... C07F 7/0878 556/460 |
| 6,303,268 | B1 | 10/2001 | Namba et al. | |
| 9,698,377 | B1 | 7/2017 | Wu et al. | |
| 10,031,420 | B2 | 7/2018 | Ongayi et al. | |
| 2017/0168390 | A1 | 6/2017 | Hsu et al. | |
| 2018/0164686 | A1* | 6/2018 | Cui | ........................ G03F 7/091 |
| 2019/0146343 | A1* | 5/2019 | Cutler | ................... C08F 230/08 430/323 |

FOREIGN PATENT DOCUMENTS

| | | |
|---|---|---|
| CN | 101609255 A | 12/2009 |
| JP | 2008076889 A | 4/2008 |
| JP | 2010122322 A | 6/2010 |
| WO | 2015137438 A1 | 4/2017 |

OTHER PUBLICATIONS

Lin et al., "Preparation of a Nanosilica-modified Negative-Type acrylate Photoresist", Journal of Applied Polymer Science, vol. 107, pp. 1179-1188, (2008), Published online Oct. 9, 2007 in Wiley InterScience (www.interscience.wiley.com). (Year: 2007).*
Tegou et al ,"Polyhedral oligomeric silsesquioxane (POSS) acrylate formulation of resist materials", Microelectronic Engineering 73-74 (2004) 238-243. (Year: 2004).*
Search report for corresponding Taiwan Application No. 107126287 dated Sep. 19, 2019.
Search report for corresponding China Application No. 201810844231.9 dated May 26, 2020.
WO2015137438, machine translation.

* cited by examiner

*Primary Examiner* — Peter L Vajda
*Assistant Examiner* — Nicholas E Brown
(74) *Attorney, Agent, or Firm* — Jonathan D. Baskin

(57) ABSTRACT

Methods of manufacturing electronic devices employing wet-strippable underlayer compositions comprising one or more condensed polymers having an organic polymer chain having pendently-bound moieties having an acidic proton and a pKa in water from −5 to 13 and having pendently-bound siloxane moieties are provided.

15 Claims, No Drawings

SILICON-CONTAINING UNDERLAYERS

The present invention relates generally to underlayers and methods of using them, and particularly to wet-strippable silicon-containing underlayers and their use in the manufacture of electronic devices.

In conventional photolithographic processes, the resist pattern is used as a mask for pattern transfer to the substrate by suitable etching processes, such as by reactive ion etch (RIE). The continued decrease in the thickness of the resist used makes the resist pattern unsuitable as a mask for pattern transfer by RIE processes. As a result, alternate processes have been developed using three, four or more layers as a mask for pattern transfer. For example, in a trilayer process a silicon-containing antireflective layer is disposed between an underlayer/organic planarizing layer and the resist layer. Due to the alternating selectivity towards fluorine and oxygen-containing RIE chemistry these layers possess, this trilayer scheme provides highly selective pattern transfer from the resist pattern on top of the Si-containing layer into the substrate below the underlayer.

The resistance of the silicon-containing underlayer toward oxide-etch chemistry allows this layer to function as an etch mask. Such silicon-containing underlayers are comprised of a crosslinked siloxane network. The etch resistance of these materials results from the silicon content, with a higher silicon content providing better etch resistance. In current 193 nm lithographic processes, such silicon-containing underlayers contain ≥40% silicon. Such high silicon content and siloxane network structure in these materials makes their removal challenging. Fluorine-containing plasma and hydrofluoric acid (HF) can both be used to remove (or strip) these silicon-containing layers. However, both F-plasma and HF will remove not only these silicon-containing materials but also other materials that are desired to remain, such as the substrate. Wet stripping using tetramethylammonium hydroxide (TMAH) in higher concentrations, such as ≥5 wt %, can be used to remove at least some of these silicon-containing layers, but these higher concentrations of TMAH also risk damaging the substrate. Silicon-containing layers having a relatively lower amount of silicon (≤17%) can sometimes be removed using "piranha acid" (concentrated $H_2SO_4$+30% $H_2O_2$), but such an approach has not proved successful with silicon-containing materials having higher silicon content.

Cao et al., *Langmuir*, 2008, 24, 12771-12778, have reported microgels formed by free radical copolymerization of N-isopropyl acrylamide and 3-(trimethoxysilyl)propyl methacrylate, followed by cross-linking via hydrolysis and condensation of the methoxysilyl groups. Cao et al. describe such materials as being useful in biological applications, such as controlled drug release materials, biosensors and in tissue engineering. U.S. Pat. No. 9,120,952 employ materials similar to those disclosed in the Cao et al. reference for use in chemical mechanical planarization processing.

U.S. Pat. No. 8,932,953 discloses a composition for forming a silicon-containing resist underlayer containing: (i) a polymer having repeat units of (A) and (B); and (ii) a silicon-containing compound obtained by hydrolysis-condensation of a mixture of (C) and (D)

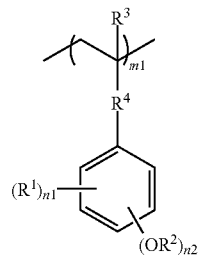
(A)

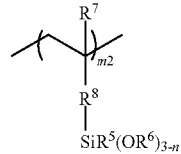
(B)

(C)

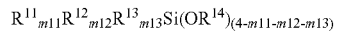
(D)

wherein $R^2$ represents an acid labile group. The compositions disclosed in this patent require the mixture of both polymers (i) and (ii). According to this patent, the use of polymer (ii) provides a composition having excellent storage stability and adhesion, and the use of polymer (i) allows both positive- and negative-tone patterning without pattern collapse. The use of the acid labile group in monomer (A) instead of an acid group is critical to the invention of U.S. Pat. No. 8,932,953. Films formed from the compositions of this patent are removed by etching processes.

The present invention provides a composition comprising: (a) one or more solvents; and (b) a condensate and/or hydrolyzate of (i) one or more organic polymers comprising as polymerized units one or more first unsaturated monomers having a moiety having an acidic proton and a pKa in water from −5 to 13, and one or more second unsaturated monomers having a condensable silicon-containing moiety, wherein the condensable silicon-containing moiety is pendent to the organic polymer backbone, and (ii) one or more condensable silicon monomers. Each of the first and second monomers are radically polymerizable.

Also provided by the present invention is a composition comprising: (a) one or more solvents; and (b) one or more condensed polymers having an organic polymer chain having pendently-bound moieties having an acidic proton and a pKa in water from −5 to 13 and having pendently-bound siloxane moieties.

The present invention further provides a method comprising (a) coating a substrate with any of the compositions described above, to form a coating layer; (b) curing the coating layer to form a polymeric underlayer; (c) disposing a layer of a photoresist on the polymeric underlayer; (d) pattern-wise exposing the photoresist layer to form a latent image; (e) developing the latent image to form a patterned photoresist layer having a relief image therein; (f) transferring the relief image to the substrate; and (g) removing the polymeric underlayer by wet stripping. The present polymeric underlayer is a polymeric silicon-containing underlayer.

Still further, the present invention provides a coated substrate having a coating layer comprising one or more condensates and/or hydrolyzates of (i) one or more organic polymers comprising as polymerized units one or more first unsaturated monomers having a moiety having an acidic proton and a pKa in water from −5 to 13, and one or more second unsaturated monomers having a condensable silicon-containing moiety, wherein the condensable silicon-containing moiety is pendent to the organic polymer backbone, and (ii) one or more condensable silicon monomers. Alternatively, the present invention provides a coated substrate having a coating layer comprising one or more condensed polymers having an organic polymer chain having pendently-bound moieties having an acidic proton and a pKa in water from −5 to 13 and having pendently-bound siloxane moieties.

It will be understood that when an element is referred to as being "adjacent" to or "on" another element, it can be directly adjacent to or on the other element or intervening elements may be present therebetween. In contrast, when an element is referred to as being "directly adjacent" or "directly on" another element, there are no intervening elements present. It will be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; ppm=part per million by weight unless otherwise noted; μm=micron=micrometer; nm=nanometer; Å=angstrom; L=liter; mL=milliliter; sec.=second; min.=minute; hr.=hour; and Da=Dalton. All amounts are percent by weight and all ratios are molar ratios, unless otherwise noted. All numerical ranges are inclusive and combinable in any order, except where it is clear that such numerical ranges are constrained to add up to 100%. Unless otherwise noted, "wt %" refers to percent by weight, based on the total weight of a referenced composition. The articles "a", "an" and "the" refer to the singular and the plural. As used herein, the term "and/or" includes any and all combinations of one or more of the associated listed items. $M_w$ refers to weight average molecular weight and is determined by gel permeation chromatography (GPC) using polystyrene standards. Reported pKa values are for aqueous solutions at 25° C. which may be determined experimentally, for example, by potentiometric titration such as by using a potentiometric pH meter available from Sirius Analytical Instruments Ltd., or may be calculated, for example, by using Advanced Chemistry Development (ACD) Labs Software Version 11.02. Unless otherwise noted, all measurements are made at room temperature.

As used throughout the specification, the term "alkyl" includes linear, branched and cyclic alkyl. The term "alkyl" refers to an alkane radical, and includes alkane monoradicals, diradicals (alkylene), and higher-radicals. If no number of carbons is indicated for any alkyl or heteroalkyl, then 1-12 carbons are contemplated. The term "heteroalkyl" refers to an alkyl group with one or more heteroatoms, such as nitrogen, oxygen, sulfur, phosphorus, replacing one or more carbon atoms within the radical, for example, as in an ether or a thioether. The term "alkenyl" refers to an alkene radical, and includes alkene monoradicals, diradicals (alkenylene), and higher-radicals. "Alkenyl" refers to linear, branched and cyclic alkene radicals unless otherwise specified. The term "alkynyl" refers to an alkyne radical, and includes alkyne monoradicals, diradicals, and higher-radicals. "Alkynyl" refers to linear and branched alkyne radicals. If no number of carbons is indicated for any alkenyl or alkynyl, then 2-12 carbons are contemplated. "Organic residue" refers to the radical of any organic moiety, which may optionally contain one or more heteroatoms, such as oxygen, nitrogen, silicon, phosphorus, and halogen, in addition to carbon and hydrogen. An organic residue may contain one or more aryl or non-aryl rings or both aryl and non-aryl rings. The term "hydrocarbyl" refers to a radical of any hydrocarbon, which may be aliphatic, cyclic, aromatic or a combination thereof, and which may optionally contain one or more heteroatoms, such as oxygen, nitrogen, silicon, phosphorus, and halogen, in addition to carbon and hydrogen. The hydrocarbyl moieties may contain aryl or non-aryl rings or both aryl and non-aryl rings, such as one or more alicyclic rings, or aromatic rings or both alicyclic and aromatic rings. When a hydrocarbyl moiety contains two or more alicyclic rings, such alicyclic rings may be isolated, fused or spirocyclic. Alicyclic hydrocarbyl moieties include single alicyclic rings, such as cyclopentyl and cyclohexyl, as well as bicyclic rings, such as dicyclopentadienyl, norbornyl, and norbornenyl. When the hydrocarbyl moiety contains two or more aromatic rings, such rings may be isolated or fused. As used herein, the term "aryl" refers to aromatic carbocycles and aromatic heterocycles, which may be optionally substituted. By the term "curing" is meant any process, such as polymerization or condensation, that increases the molecular weight of a material or composition. "Curable" refers to any material capable of being cured under certain conditions. The term "oligomer" refers to dimers, trimers, tetramers and other relatively low molecular weight materials that are capable of further curing. The term "polymer" includes oligomers and refers to homopolymers, copolymers, terpolymers, tetrapolymers and the like. As used herein, the term "(meth)acrylate" refers to both acrylate and methacrylate. Likewise, the terms "(meth)acrylic acid", "(meth)acrylonitrile" and "(meth)acrylamide" refer to acrylic acid and methacrylic acid, acrylonitrile and methacrylonitrile, and acrylamide and methacrylamide, respectively.

Compositions useful in the present invention comprise a condensed polymer. The present condensed polymers, and films and underlayers formed therefrom, are wet strippable. As used herein, the term "condensed polymer" refers to a condensate and/or hydrolyzate of (i) one or more organic polymers comprising as polymerized units one or more first unsaturated monomers having a moiety having an acidic proton and a pKa in water from −5 to 13 and one or more second unsaturated monomers having a condensable silicon-containing moiety, wherein the condensable silicon-containing moiety is pendent to the organic polymer backbone, and (ii) one or more condensable silicon monomers. As used herein, the term "condensate and/or hydrolyzate" refers to a condensation product, a hydrolysis product, a hydrolysis-condensation product, or a combination of any of the foregoing.

The present condensed polymers have an organic polymer chain (or backbone) having pendently-bound moieties having an acidic proton and a pKa in water from −5 to 13 and having pendently-bound siloxane moieties. The organic polymer chain comprises as polymerized units, preferably free-radically polymerized units, one or more first unsaturated monomers having a moiety having an acidic proton and a pKa in water from −5 to 13 and one or more second unsaturated monomers having a condensable silicon-containing moiety. Upon polymerization, preferably free-radical polymerization, of the one or more first unsaturated monomers and one or more second unsaturated monomers, the resulting organic polymer chain has one or more pendent moieties having an acidic proton and a pKa in water from −5 to 13 and one or more pendent condensable silicon-containing moieties. The one or more pendent condensable silicon-containing moieties of the organic polymer chain are then condensed and/or hydrolyzed with one or more condensable silicon monomers to form the present condensed polymers having pendently-bound moieties having an acidic proton and a pKa in water from −5 to 13 and having pendently-bound siloxane moieties. As used herein, the term "siloxane moieties" refers to moieties having an (Si—O) repeat unit. The organic polymers of the invention may optionally, and preferably do, comprise as polymerized units one or more third unsaturated monomers. Preferably, each of the first unsaturated monomers and second unsaturated monomers comprise one radical polymerizable double or triple bond, more preferably one radical polymerizable carbon-carbon double or triple bond, and even more preferably one radical polymerizable carbon-carbon double bond. The present condensed polymers are preferably free of repeating units of a monomer having two or more radical polymerizable double bonds.

Any unsaturated monomer having a moiety having an acidic proton and a pKa in water from −5 to 13 is suitable for use as the first unsaturated monomer to form the present condensed polymer. Preferably, the first unsaturated monomer has a moiety having an acidic proton and a pKa in water of from −3 to 8, and more preferably from 2 to 8. A mixture of unsaturated first monomers may be used. Preferably, the first unsaturated monomer has one or more carbon-carbon double bonds, carbon-carbon triple bonds, or a combination thereof, more preferably one or more carbon-carbon double bonds, and yet more preferably one carbon-carbon double bond. The moiety having an acidic proton and a pKa in water from −5 to 13 may be, but are not limited to; moieties having one or more acid groups chosen from carboxylic acid, sulfonic acid, sulfinic acid, sulfamic acid, phosphonic acid, boronic acid, and combinations and acid salts thereof; moieties having one or more hydroxyaryl groups; moieties having one or more unsubstituted imide groups (—C(=O)—NH—C(=O)—); moieties having one or more mercapto groups such as a $C_{1-20}$-mercaptoalkyl; moieties having one or more $C_{1-20}$-hydroxyl-substituted haloalkyl groups, and combinations of the foregoing. Preferred moieties having an acidic proton and a pKa in water of from −5 to 13 are moieties having one or more acid groups chosen from carboxylic acid, sulfonic acid, phosphonic acid, boronic acid, and combinations and acid salts thereof, moieties having one or more $C_{6-20}$-hydroxyaryl groups, moieties having one or more mercapto groups such as a $C_{1-20}$-mercaptoalkyl, and moieties having one or more $C_{1-12}$-hydroxyl-substituted haloalkyl groups, and more preferably moieties having one or more acid groups chosen from carboxylic acid, sulfonic acid, phosphonic acid, boronic acid, and combinations and acid salts thereof, and yet more preferably moieties having one or more carboxylic acid groups. As used herein, "acid salt" refers to an alkali metal salt, an alkaline earth salt, and an ammonium salt of carboxylic acid, sulfonic acid, sulfinic acid, sulfamic acid, phosphonic acid, and boronic acid. Suitable ammonium salts are those of the formula $N(R_a)_4^+$, wherein each $R_a$ is independently H or $C_{1-10}$-alkyl. Preferably, the $C_{1-20}$-hydroxyl-substituted haloalkyl groups are $C_{1-20}$-hydroxyl-substituted fluoroalkyl groups, more preferably $C_{1-20}$-hydroxyl-substituted perfluoroalkyl groups, and even more preferably $C_{1-12}$-hydroxyl-substituted perfluoroalkyl groups such as hexafluoro-iso-propanolyl. Suitable first unsaturated monomers having a moiety having an acidic proton and a pKa in water from −5 to 13 are generally commercially available from a variety of sources, such as Sigma-Aldrich (St. Louis, Mo.), or may be prepared by methods known in the art.

Preferred first unsaturated monomers are those of formula (1)

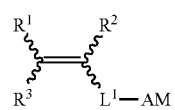

(1)

wherein $L^1$ is a single bond or a divalent linking group; AM is an acidic moiety having an acidic proton and having a pKa in water from −5 to 13; each of $R^1$ and $R^2$ is independently chosen from H, $C_{1-4}$-alkyl, $C_{1-4}$-haloalkyl, optionally substituted $C_{6-2}$-aryl, halogen, and CN; $R^3$ is chosen from H, $C_{1-10}$-alkyl, $C_{1-10}$-haloalkyl, optionally substituted $C_{6-20}$-aryl, halogen, and —C(=O)$R^4$; $R^4$ is chosen from $OR^5$ and $N(R^6)_2$; $R^5$ is chosen from H, $C_{1-20}$-alkyl, $C_{5-30}$-aryl, $C_{6-20}$-aralkyl and a monovalent organic residue having a lactone moiety; and each $R^6$ is independently chosen from H, $C_{1-20}$-alkyl, and $C_{6-20}$-aryl; wherein any two of $L^1$, $R^1$, $R^2$ and $R^3$ may be taken together with the carbons to which they are attached to form a 5 to 7-membered ring. Preferably, each of $R^1$ and $R^2$ is independently chosen from H, $C_{1-4}$-alkyl, $C_{1-4}$-haloalkyl, optionally substituted $C_{6-20}$-aryl, and halogen, and more preferably from H, $C_{1-4}$-alkyl, $C_{1-4}$-haloalkyl, and optionally substituted $C_{6-10}$-aryl. A preferred halogen is fluorine. It is preferred that $R^3$ is chosen from H, $C_{1-10}$-alkyl, $C_{1-10}$-haloalkyl, optionally substituted $C_{6-20}$-aryl, and —C(=O)$R^4$, and more preferably from H, $C_{1-10}$-alkyl, $C_{1-10}$-haloalkyl, optionally substituted $C_{6-10}$-aryl, and —C(=O)$R^4$. $R^4$ is preferably $OR^5$. It is preferred that $R^5$ is H, $C_{1-20}$-alkyl, $C_{5-30}$-aryl, and $C_{6-20}$-aralkyl, and more preferably H. Each $R^6$ is preferably chosen from H, and $C_{1-20}$-alkyl. $L^1$ is preferably a single covalent bond or a divalent organic radical having from 1 to 20 carbon atoms and optionally one or more heteroatoms, more preferably $L^1$ is a single covalent bond or a divalent hydrocarbyl radical having from 1 to 20 carbon atoms and optionally one or more oxygen atoms, and still more preferably $L^1$ is chosen from a single covalent bond, a divalent $C_{1-20}$-aliphatic moiety optionally comprising one or more oxygen atoms, a divalent optionally substituted $C_{6-20}$-aryl moiety, and a divalent optionally substituted $C_{7-20}$-alkylaryl moiety. Preferably, AM is chosen from —C(=O)—OH, —S(=O)$_2$—OH, —P(=O)(OH)$_2$, —B(OH)$_2$, $C_{6-20}$-hydroxyaryl, mercapto, and $C_{1-12}$-hydroxy-perfluoroalkyl, and more preferably from —C(=O)—OH, —S(=O)$_2$—OH, —P(=O)(OH)$_2$, —B(OH)$_2$, $C_{6-20}$-hydroxyaryl, mercapto, and $C_{1-6}$-hydroxy-perfluoroalkyl such as hexafluoro-iso-propanolyl, and more preferably AM is —C(=O)—OH. $L^1$ and $R^3$ or $R^1$ and $R^2$ may taken together along with the carbons to which they are attached to form a 5- to 7-membered unsaturated ring, preferably a 5- to 6-membered unsaturated ring, and more preferably a 5- to 6-membered unsaturated carbocyclic ring. $R^1$ and $R^3$ or $R^2$ and $L^1$ may be taken together along with the carbons to which they are attached to form a 5- to 7-membered saturated or unsaturated ring, preferably a 5- to 6-membered saturated or unsaturated ring, and more preferably a 5- to 6-membered saturated or unsaturated carbocyclic ring. It is preferred that aryl moieties are aromatic carbocycles. "Optionally substituted" aryl refers to both unsubstituted and substituted aryl. "Substituted aryl" refers to any aryl (or aromatic) moiety having one or more of its hydrogens replaced with one or more substituents chosen from hydroxy, halogen, $C_{1-6}$-alkyl, $C_{1-6}$-haloalkyl, $C_{1-6}$-alkoxy, $C_{1-6}$-haloalkoxy, phenyl, and phenoxy, preferably from hydroxy, halogen, $C_{1-6}$-alkyl, $C_{1-6}$-alkoxy, phenyl, and phenoxy, and more preferably from hydroxy, halogen, $C_{1-6}$-alkyl, and phenyl. Preferably, a substituted aryl has from 1 to 3 substituents, and more preferably 1 or 2 substituents.

Exemplary first unsaturated monomers having one or more carbon-carbon double bonds include, without limitation: vinyl hydroxyaromatic monomers such as hydroxystyrene, hydroxyvinylnaphthalene, hydroxyvinylanthracene, o-courmaric acid, m-courmaric acid, and p-courmaric acid; carboxyl-substituted vinyl aromatic monomers such as vinyl benzoic acid; ethylenically unsaturated carboxylic acids such as cinnamic acid, maleic acid, fumaric acid, crotonic acid, citraconic acid, itaconic acid, 3-pyridine (meth)acrylic acid, 2-phenyl (meth)acrylic acid, (meth)acrylic acid, 2-methylenemalonic acid, cyclopentenecarboxylic acid, methylcyclopentenecarboxylic acid, cyclohexenecarboxylic acid, and 3-hexene-1,6-dicarboxylic acid; hydroxyaryl esters of ethylenically unsaturated carboxylic acids such as hydroxyphenyl (meth)acrylate, hydroxybenzyl (meth)acrylate, hydroxynaphthyl (meth)acrylate, and hydroxyanthracenyl (meth)acrylate; vinylbenzeneboronic acid; vinylbenzenesulfonic acid; vinylphosphonic acid; vinylsulfonic acid; allylboronic acid; allylphosphoric acid; allylsulfonic acid; and 4-((7-((methacryloyloxy)methyl)naphthalen-1-yl)oxy)-4-oxobutanoic acid; N-vinylsulfamic acid; vinyl mercaptoalkyl monomers such as mercaptoethyl (meth)acrylate, mercaptopropyl (meth)acrylate, and mercaptobutyl (meth)acrylate; vinyl imides such as maleimide; and preferably $C_{3-20}$ ethylenically unsaturated carboxylic acids. Preferred first unsaturated monomers having one or more carbon-carbon double bonds are hydroxyvinylnaphthalene, hydroxyvinylanthracene, o-courmaric acid, m-courmaric acid, p-courmaric acid, vinyl benzoic acid, cinnamic acid, maleic acid, fumaric acid, crotonic acid, citraconic acid, itaconic acid, 3-pyridine (meth)acrylic acid, 2-phenyl (meth) acrylic acid, (meth)acrylic acid, 2-methylenemalonic acid, cyclopentenecarboxylic acid, methylcyclopentenecarboxylic acid, cyclohexenecarboxylic acid, 3-hexene-1,6-dicarboxylic acid, hydroxyphenyl (meth)acrylate, hydroxybenzyl (meth)acrylate, hydroxynaphthyl (meth)acrylate, hydroxyanthracenyl (meth)acrylate, styrylboronic acid, styrylsulfonic acid, vinylphosphonic acid, vinylsulfonic acid, allylboronic acid, allylphosphoric acid, and allylsulfonic acid; and more preferably o-courmaric acid, m-courmaric acid, p-courmaric acid, vinyl benzoic acid, cinnamic acid, maleic acid, fumaric acid, crotonic acid, citraconic acid, itaconic acid, 3-pyridine (meth)acrylic acid, 2-phenyl (meth)acrylic acid, (meth)acrylic acid, 2-methylenemalonic acid, cyclopentenecarboxylic acid, methylcyclopentenecarboxylic acid, cyclohexenecarboxylic acid, 3-hexene-1,6-dicarboxylic acid, hydroxyphenyl (meth)acrylate, hydroxybenzyl (meth)acrylate, hydroxynaphthyl (meth)acrylate, hydroxyanthracenyl (meth)acrylate, styrylboronic acid, styrylsulfonic acid, vinylphosphonic acid, vinylsulfonic acid, allylboronic acid, allylphosphoric acid, and allylsulfonic acid. Exemplary first unsaturated monomers having one or more carbon-carbon triple bonds include, without limitation: acetylene carboxylic acid; acetylene dicarboxylic acid; butynylcarboxylic acid; ethynylbenzoic acid; ethynylbenzene dicarboxylic acid; diethynylbenzoic acid; ethynylnaphthoic acid; ethynylphenol; ethynylnaphthol; ethynylanthracenol; diethynylphenol; and diethynylnaphthol; and preferably acetylene carboxylic acid; acetylene dicarboxylic acid; ethynylbenzoic acid; ethynylbenzene dicarboxylic acid; diethynylbenzoic acid; and ethynylnaphthoic acid.

Any unsaturated monomer having a condensable silicon-containing moiety is suitable for use as the second unsaturated monomer to form the present condensed polymer. One or more second unsaturated monomers may be used. Ethylenically unsaturated monomers having a condensable silicon-containing moiety are preferred. Preferred second unsaturated monomers are those having a condensable silicon-containing moiety of the formula (2)

$$*-L^2-SiR^7{}_bY^1{}_{3-b} \qquad (2)$$

wherein $L^2$ is a single bond or a divalent linking group; each $R^7$ is independently chosen from H, $C_{1-10}$-alkyl, $C_{2-20}$-alkenyl, $C_{5-20}$-aryl, and $C_{6-20}$-aralkyl; each $Y^1$ is independently chosen from halogen, $C_{1-10}$-alkoxy, $C_{5-10}$-aryloxy, and $C_{1-10}$-carboxy; b is an integer from 0 to 2; and * denotes the point of attachment to the monomer. It is preferred that $L^2$ is a divalent linking group, and more preferably a divalent linking group comprising one or more heteroatoms chosen from oxygen and silicon. A suitable divalent linking group is a divalent organic radical having from 1 to 20 carbon atoms and optionally one or more heteroatoms. Preferred divalent linking groups have the formula —C(=O)—O-$L^3$- wherein $L^3$ is a single bond or an organic radical having from 1 to 20 carbon atoms. It is preferred that $L^3$ is an organic radical having from 2 to 10 carbon atoms. Preferably, each $R^7$ is independently chosen from $C_{1-10}$-alkyl, $C_{2-20}$-alkenyl, $C_{5-20}$-aryl, and $C_{6-20}$-aralkyl. It is preferred that each $Y^1$ is independently chosen from halogen, $C_{1-6}$-alkoxy, $C_{5-10}$-aryloxy, $C_{1-6}$-carboxy, and more preferably from halogen, $C_{1-6}$-alkoxy, and $C_{1-6}$-carboxy. Preferably, b is 0 or 1, and more preferably b=0.

It is preferred that at least one second unsaturated monomer has the formula (3)

$$(3)$$

wherein $L^2$ is a single bond or a divalent linking group; each $R^7$ is independently chosen from H, $C_{1-10}$-alkyl, $C_{2-20}$-alkenyl, $C_{5-20}$-aryl, and $C_{6-20}$-aralkyl; each of $R^8$ and $R^9$ are independently chosen from H, $C_{1-4}$-alkyl, $C_{1-4}$-haloalkyl, halogen, $C_{5-20}$-aryl, $C_{6-20}$-aralkyl, and CN; $R^{10}$ is chosen from H, $C_{1-10}$-alkyl, $C_{1-10}$-haloalkyl, halogen, $C_{5-20}$-aryl, $C_{6-20}$-aralkyl, and C(=O)$R^{11}$; $R^{11}$ is chosen from O$R^{12}$ and N($R^{13}$)$_2$; $R^{12}$ is chosen from H, $C_{1-20}$ alkyl, $C_{5-20}$-aryl, and $C_{6-20}$-aralkyl; each $R^{13}$ is independently chosen from H, $C_{1-2}$-alkyl, and $C_{5-20}$-aryl; each $Y^1$ is independently chosen from halogen, $C_{1-10}$-alkoxy, $C_{5-10}$-aryloxy, and $C_{1-10}$-carboxy; and b is an integer from 0 to 2. It is preferred that $L^2$ is a divalent linking group, and more preferably a divalent linking group comprising one or more heteroatoms chosen from oxygen and silicon. A suitable divalent linking group for $L^2$ is an organic radical having from 1 to 20 carbon atoms and optionally one or more heteroatoms. Preferred divalent linking groups have the formula —C(=O)—O—L$^3$- wherein L$^3$ is a single bond or an organic radical having from 1 to 20 carbon atoms. It is preferred that L$^3$ is an organic radical having from 2 to 10 carbon atoms. Preferably, each R$^7$ is independently chosen from C$_{1-10}$-alkyl, C$_{2-10}$-alkenyl, C$_{5-20}$-aryl, and C$_{6-20}$-aralkyl. It is preferred that each Y$^1$ is independently chosen from halogen, C$_{1-6}$-alkoxy, C$_{5-10}$-aryloxy, and C$_{1-6}$-carboxy, and more preferably from halogen, C$_{1-6}$-alkoxy, and C$_{1-6}$-carboxy. Preferably, b is 0 or 1, and more preferably b=0. It is preferred that each R$^8$ and R$^9$ are independently chosen from H, C$_{1-4}$-alkyl, C$_{1-4}$-haloalkyl, C$_{5-20}$-aryl, and C$_{6-20}$-aralkyl, and more preferably from H, C$_{1-4}$-alkyl, C$_{5-20}$-aryl, and C$_{6-20}$-aralkyl. Yet more preferably, each R$^8$ and R$^9$ are independently chosen from H, methyl, ethyl, propyl, butyl, phenyl, naphthyl, benzyl, and phenethyl. R$^{10}$ is preferably chosen from H, C$_{1-10}$-alkyl, C$_{1-10}$-haloalkyl, C$_{5-20}$-aryl, C$_{6-20}$-aralkyl, and C(=O)R$^{11}$, and more preferably from H, C$_{1-10}$-alkyl, C$_{5-20}$-aryl, C$_{6-20}$-aralkyl, and C(=O)R$^{11}$. It is preferred that R$^{11}$ is OR$^{12}$. R$^{12}$ is preferably chosen from H, C$_{1-10}$-alkyl, C$_{5-10}$-aryl, and C$_{6-15}$-aralkyl. Preferably, each R$^{13}$ is independently chosen from H, C$_{1-10}$-alkyl, and C$_{6-20}$-aryl.

Suitable second unsaturated monomers having a condensable silicon-containing moiety are generally commercially available from a variety of sources, such as Sigma-Aldrich (St. Louis, Mo.), or may be prepared by methods known in the art. Such monomers may be used as-is, or may be further purified. Exemplary second unsaturated monomers include, but are not limited to: allyl dimethoxysilane; allyl dichlorosilane; (trimethoxysilyl)methyl (meth)acrylate; (trimethoxysilyl)ethyl (meth)acrylate; (trimethoxysilyl)propyl (meth)acrylate; (trimethoxysilyl)butyl (meth)acrylate; (triethoxysilyl)methyl (meth)acrylate; (triethoxysilyl)ethyl (meth)acrylate; (triethoxysilyl)propyl (meth)acrylate; (triethoxysilyl)butyl (meth)acrylate; (trichlorosilyl)methyl (meth)acrylate; (trichlorosilyl)ethyl (meth)acrylate; (trichlorosilyl)propyl (meth)acrylate; (trichlorosilysilyl)butyl (meth)acrylate; (methyldimethoxysilyl)propyl (meth)acrylate; vinyltriacetoxysilane; (triacetoxysilyl)propyl (meth) acrylate; 4-((trimethoxysilyl)propyl)styrene; 4-(trimethoxysilyl)styrene; and vinyltrimethoxysilane.

The condensed polymers of the invention may further comprise one or more third unsaturated monomers, where such third monomers are free of an acidic moiety having an acidic proton and having a pKa in water of −5 to 13, and free of a condensable silicon-containing moiety. Preferably, the condensed polymers further comprise as polymerized units one or more third unsaturated monomers of formula (4)

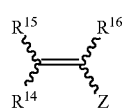

(4)

wherein Z is chosen from unsubstituted C$_{5-30}$-aryl moiety, substituted C$_{5-30}$-aryl moiety, CN, and —C(=O)R$^{17}$; R$^{14}$ is chosen from H, C$_{1-10}$-alkyl, C$_{1-10}$-haloalkyl, halogen, and —C(=O)R$^{18}$; each of R$^{15}$ and R$^{16}$ are independently chosen from H, C$_{1-4}$-alkyl, C$_{1-4}$-haloalkyl, halogen, and CN; each of R$^{17}$ and R$^{18}$ is independently chosen from OR$^{19}$ and N(R$^{20}$)$_2$; R$^{19}$ is chosen from H, C$_{1-20}$-alkyl, C$_{5-30}$-aryl, C$_{6-20}$-aralkyl and a monovalent organic residue having a lactone moiety; and each R$^{20}$ is independently chosen from H, C$_{1-20}$-alkyl, and C$_{6-20}$-aryl; wherein Z and R$^{14}$ may be taken together to form a 5 to 7-membered unsaturated ring.

When Z is an unsubstituted C$_{5-30}$-aryl moiety or a substituted C$_{5-30}$-aryl moiety, it is preferred that such aryl moieties are aromatic carbocycles. When Z is a substituted C$_{5-30}$-aryl moiety, such aryl moiety has one or more of its hydrogens replaced with one or more substituents chosen from halogen, C$_{1-6}$-alkyl, C$_{1-6}$-haloalkyl, C$_{1-6}$-alkoxy, C$_{1-6}$-haloalkoxy, phenyl, and phenoxy, preferably from halogen, C$_{1-6}$-alkyl, C$_{1-6}$-alkoxy, phenyl, and phenoxy, and more preferably from halogen, C$_{1-6}$-alkyl, and phenyl. Preferably, such substituted C$_{5-30}$-aryl has from 1 to 3 substituents, and more preferably 1 or 2 substituents.

Exemplary ethylenically third unsaturated monomers include, without limitation: vinyl aromatic monomers such as styrene, α-methylstyrene, β-methylstyrene, stilbene, vinylnaphthylene, acenaphthalene, and vinylpyridine; ethylenically unsaturated anhydride monomers such as maleic anhydride, citraconic anhydride and itaconic anhydride, ethylenically unsaturated carboxylic acid esters such as crotonic acid esters, itaconic acid esters, and (meth)acrylate esters; (meth)acrylonitrile; (meth)acrylamides; and the like. Suitable (meth)acrylate ester monomers useful as the unsaturated third monomers include, but are not limited to, C$_{6-20}$-aryl (meth)acrylates, C$_{1-10}$-hydroxyalkyl (meth)acrylates, glycidyl (meth)acrylate, and C$_{1-10}$-alkyl (meth)acrylates. Exemplary (meth)acrylate ester monomers include, without limitation, benzyl acrylate, benzyl methacrylate, hydroxyethyl acrylate, hydroxyethyl methacrylate, hydroxypropyl acrylate, hydroxypropyl methacrylate, glycidyl methacrylate, methyl acrylate, methyl methacrylate, phenyl methacrylate, naphthyl methacrylate, and anthracenyl methacrylate.

Preferred third unsaturated monomers are those of formula (5)

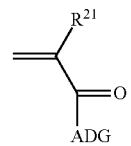

(5)

wherein ADG is an acid decomposable group; and R$^{21}$ is chosen from H, C$_{1-4}$-alkyl, C$_{1-4}$-haloalkyl, halogen, and CN. R$^{21}$ is preferably chosen from H, C$_{1-4}$-alkyl, C$_{1-4}$-fluoroalkyl, fluoro, and CN, more preferably from H, C$_{1-4}$-alkyl, trifluoromethyl, fluoro, and CN, even more preferably from H, methyl, trifluoromethyl, fluoro, and CN, and most preferably R$^{21}$ is H or methyl. In formula (5), ADG is an acid decomposable group having from 2 to 30 carbon atoms. The term "acid decomposable group", as used herein, refers to any functional group capable of being decomposed by acid to form a different functional group having increased aqueous base solubility as compared to the acid decomposable group. Suitable acid decomposable groups include, but are not limited to, —O—C$_{4-30}$-hydrocarbyl moiety where the C$_{4-30}$-hydrocarbyl moiety is bonded to the oxygen atom through a tertiary carbon atom, a C$_{2-30}$-hydrocarbyl moiety having an anhydride moiety, a C$_{2-30}$-hydrocarbyl moiety having an imide moiety, and a C$_{4-30}$-organic residue comprising an acetal functional group. Preferred acid decomposable groups are —O—C$_{4-30}$-hydrocarbyl moiety where the C$_{4-30}$-hydrocarbyl moiety is bonded to the oxygen atom through a tertiary carbon atom, and a C$_{4-30}$-organic residue comprising an acetal functional group, and more preferably —O—C$_{4-30}$-hydrocarbyl moiety where the C$_{4-20}$-hydrocarbyl moiety is bonded to the oxygen atom through a tertiary carbon atom, and a $C_{4-20}$-organic residue comprising an acetal functional group. As used herein, the term "acetal" also embraces "ketal", "hemiacetal", and "hemiketal." Exemplary acid decomposable groups include, without limitation, —$NR^{22}R^{23}$, —$OR^{24}$, and —O—C(=O)—$R^{25}$, wherein $R^{22}$ and $R^{23}$ are each independently chosen from H, $C_{1-20}$-alkyl, and $C_{5-10}$-aryl; $R^{24}$ is a $C_{4-30}$-organic residue bound to the oxygen through a tertiary carbon (that is, a carbon that is bound to three other carbons) or a $C_{4-30}$-organic residue comprising an acetal functional group; and $R^{25}$ is chosen from H, $C_{1-30}$-alkyl, and $C_{5-30}$-aryl. Preferably, $R^{24}$ has from 4 to 20 carbon atoms. It is further preferred that $R^{24}$ is a branched or cyclic moiety. When $R^{24}$ contains a cyclic moiety, such cyclic moiety typically has from 4 to 8 atoms in the ring, and preferably 5 or 6 atoms in the ring. $R^{24}$ may optionally contain one or more heteroatoms such as oxygen. Preferably, $R^{24}$ is a branched aliphatic or a cycloaliphatic moiety optionally containing one or more heteroatoms.

Preferred compounds of formula (5) are those of formula (5a)

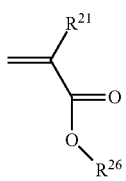

(5a)

wherein $R^{26}$ is chosen from a $C_{4-20}$-organic residue bound to the oxygen through a tertiary carbon or a $C_{4-20}$-organic residue comprising an acetal functional group; and $R^{21}$ is chosen from H, $C_{1-4}$-alkyl, $C_{1-4}$-haloalkyl, halogen, and CN. More preferably, $R^{26}$ has the structure shown in formula (6a) or (6b)

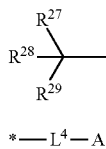

(6a)

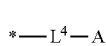

(6b)

wherein each of $R^{27}$, $R^{28}$ and $R^{29}$ is independently an organic residue having from 1 to 6 carbon atoms; $R^{27}$ and $R^{28}$ may be taken together to form a 4 to 8 membered ring; $L^4$ is a divalent linking group or a single chemical bond; A represents an acetal functional group; and * indicates the point of attachment to the ester oxygen. It is preferred that each of $R^{27}$, $R^{28}$ and $R^{29}$ is independently chosen from $C_{1-6}$-alkyl. When $R^{27}$ and $R^{28}$ are taken together to form a 4 to 8 membered ring, such ring may be a single ring or may be polycyclic, and may optionally contain one or more heteroatoms chosen from oxygen, sulfur and nitrogen, preferably oxygen and sulfur and more preferably oxygen. Preferably, $R^{27}$ and $R^{28}$ may be taken together to form a 5 to 8 membered ring. Suitable 4 to 8 membered rings include, but are not limited to, cyclopentyl, cyclohexyl, cycloheptyl, cyclooctyl, norbornyl, and oxabicylco[2.2.1]heptyl, preferably cyclopentyl, cyclohexyl, norbornyl, and oxabicylco [2.2.1]heptyl, and more preferably cyclopentyl and cyclohexyl. Suitable divalent linking groups include $C_{1-10}$-alkylene, and preferably $C_{1-5}$-alkylene. Preferably, the acetal functional group is a 5 or 6-membered ring cyclic ketal, and more preferably a cyclic ketal formed from acetone. Exemplary moieties for $R^{26}$ include, without limitation: tert-butyl; 2,3-dimethyl-2-butyl; 2,3,3-trimethyl-2-butyl; 2-methyl-2-butyl; 2-methyl-2-pentyl; 3-methyl-3-pentyl; 2,3,4-trimethyl-3-pentyl; 2,2,3,4,4-pentamethyl-3-pentyl; 1-methyl-1-cyclopentyl; 1-ethyl-1-cyclopentyl; 1,2-dimethyl-1-cyclopentyl; 1,2,5-trimethyl-1-cyclopentyl; 1,2,2-trimethyl-cyclopentyl; 1,2,2,5-tetramethyl-1-cyclopentyl; 1,2,2,5,5-pentamethyl-1-cyclopentyl; 1-methyl-1-cyclohexyl; 1-ethyl-1-cyclohexyl; 1,2-dimethyl-1-cyclohexyl; 1,2,6-trimethyl-1-cyclohexyl; 1,2,2,6-tetramethyl-1-cyclohexyl; 1,2,2,6,6-pentamethyl-1-cyclohexyl; 2,4,6-trimethyl-4-heptyl; 3-methyl-3-norbornyl; 3-ethyl-3-norbornyl; 6-methyl-2-oxabicylco[2.2.1]hept-6-yl; and 2-methyl-7-oxabicylco [2.2.1]hept-2-yl. Preferably, $R^5$ is chosen from tert-butyl; 2,3-dimethyl-2-butyl; 2,3,3-trimethyl-2-butyl; 2-methyl-2-butyl; 2-methyl-2-pentyl; 3-methyl-3-pentyl; 2,3,4-trimethyl-3-pentyl; 2,2,3,4,4-pentamethyl-3-pentyl; 1-methyl-1-cyclopentyl; 1-ethyl-1-cyclopentyl; 1,2-dimethyl-1-cyclopentyl; 1,2,5-trimethyl-1-cyclopentyl; 1,2,2-trimethyl-cyclopentyl; 1,2,2,5-tetramethyl-1-cyclopentyl; 1,2,2,5,5-pentamethyl-1-cyclopentyl; 1-methyl-1-cyclohexyl; 1-ethyl-1-cyclohexyl; 1,2-dimethyl-1-cyclohexyl; 1,2,6-trimethyl-1-cyclohexyl; 1,2,2,6-tetramethyl-1-cyclohexyl; 1,2,2,6,6-pentamethyl-1-cyclohexyl; and 2,4,6-trimethyl-4-heptyl. $L^4$ is preferably a divalent linking group. Suitable divalent linking groups for $L^4$ have are organic residues having from 1 to 20 atoms, and more preferably from 1 to 20 carbon atoms. Optionally, the divalent linking groups of $L^4$ may contain one or more heteroatoms, such as oxygen, nitrogen or a combination thereof. Suitable monomers of formulae (4), (5) and (5a) may be available commercially or made by a variety of methods known in the art, such as is disclosed in U.S. Pat. Nos. 6,136,501; 6,379,861; and 6,855,475.

Other preferred monomers of formula (5) are those of formula (7)

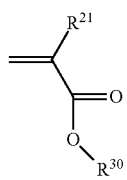

(7)

wherein $R^{21}$ is independently chosen from H, $C_{1-4}$-alkyl, $C_{1-4}$-haloalkyl, halogen, and CN; and $R^{30}$ is a monovalent organic residue having a lactone moiety. In formula (7), $R^{30}$ is a $C_{4-20}$-monovalent organic residue comprising a lactone moiety. $R^{30}$ may comprise any suitable lactone moiety, and preferably comprises a 5 to 7-membered lactone, which may be optionally substituted. Suitable substituents on the lactone ring are $C_{1-10}$-alkyl moieties. Suitable lactone moieties for $R^{30}$ are those having formula (8)

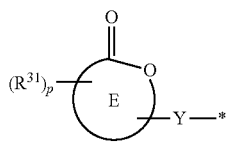

(8)

wherein E is a 5 to 7-membered ring lactone; each $R^{31}$ is independently chosen from $C_{1-10}$-alkyl; p is an integer from 0 to 3; Y is a chemical bond or a divalent linking residue having from 1 to 10 carbon atoms; and * indicates the point of attachment to the oxygen atom of the ester. It is preferred that each $R^{31}$ is independently chosen from $C_{1-6}$-alkyl, and more preferably $C_{1-4}$-alkyl. Examples of $R^{31}$ are methyl, ethyl, n-propyl, iso-propyl, n-butyl, sec-butyl, and iso-butyl. Preferably, p=0 or 1. Suitable divalent linking residues for Y include, but are not limited to, divalent organic residues having from 1 to 20 carbon atoms. Suitable divalent organic residues for Y include, without limitation, $C_{1-20}$-hydrocarbyl moieties, $C_{1-20}$-heteroatom-containing hydrocarbyl moieties, and substituted $C_{1-20}$-hydrocarbyl moieties. The term "$C_{1-20}$-heteroatom-containing hydrocarbyl moieties" refers to hydrocarbyl moieties having one or more heteroatoms, such as nitrogen, oxygen, sulfur, phosphorus, within the hydrocarbyl chain. Exemplary heteroatoms include, but are not limited to, —O—, —S—, —N(H)—, —N($C_{1-20}$-hydrocarbyl)-, —C(=O)—O—, —S(=O)—, —S(=O)$_2$—, —C(=O)—NH—, and the like. "Substituted $C_{1-20}$-hydrocarbyl moieties" refers to any hydrocarbyl moiety having one or more hydrogens replaced with one or more substituents such as halogen, cyano, hydroxy, amino, mercapto, and the like. It is preferred that $R^{30}$ is chosen from gamma-butyrolactone (GBLO), beta-butyrolactone, gamma-valerolactone, delta-valerolactone, and caprolactone, and more preferably, $R^{30}$ is GBLO. Monomers of formula (7) are generally commercially available or may be prepared by methods known in the art.

In one preferred embodiment, the organic polymer comprises as polymerized units, one or more unsaturated monomers comprising a chromophore. Suitable chromophores are any aromatic (or aryl) moiety that absorbs radiation at the wavelength of interest. Such chromophores are unsubstituted aromatic moieties, such as phenyl, benzyl, naphthyl, anthracenyl, and the like, or may be substituted with one or more of hydroxyl, $C_{1-10}$-alkyl, $C_{2-10}$-alkenyl, $C_{2-10}$-alkynyl, and $C_{5-30}$-aryl, and preferably is unsubstituted or hydroxyl-substituted. When an unsaturated chromophore-containing monomer having a hydroxy-substituted aryl moiety is used, it will be appreciated by those skilled in the art that such monomer is a first unsaturated monomer as described above. Preferably, the organic polymer comprises as polymerized units, one or more unsaturated monomers of formula (4) having a chromophore moiety, where such chromophore moiety is not a hydroxyaryl moiety. Preferred chromophore moieties are chosen from furyl, pyryl, thiophenyl, pyridyl, phenyl, naphthyl, acenaphthyl, fluorenyl, carbazolyl, anthracenyl, phenanthryl, pyrenyl, coronenyl, tetracenyl, pentacenyl, tetraphenyl, benzotetracenyl, triphenylenyl, perylenyl, benzyl, phenethyl, tolyl, xylyl, styrenyl, vinylnaphthyl, vinylanthracenyl, dibenzothiophenyl, thioxanthonyl, indolyl, acridinyl, and the like, and more preferably phenyl, naphthyl, anthracenyl, phenanthryl, benzyl, and the like. Chromophores used in the present invention are free of aromatic rings having a substituent of the structure *—C(Rx)$_2$-O-Lg, each Rx is independently H or a alkyl group of 1 to 15 carbons, where each Rx may be taken together form an aliphatic ring; Lg is H, an aliphatic monovalent hydrocarbon having 1 to 10 carbons, or a monovalent aromatic group, and * indicates the point of attachment to the aromatic ring. That is, the chromophores do not have an aromatic ring having a substituent where an sp3 hybridized carbon is bonded directly to the aromatic ring and to an oxy group.

The present condensed polymers preferably comprise an organic polymer chain comprising as polymerized units one or more monomers of formula (1) and one or more monomers of formula (3). The mole ratio of the total monomers of formula (1) to the total monomers of formula (3) is from 99:1 to 1:99, preferably from 95:5 to 5:95, more preferably from 95:5 to 55:45, and yet more preferably from 90:10 to 60:40. It is preferred that the total moles of the monomers of formula (1) is greater than the total moles of the monomers of formula (3). It is preferred that the present condensed polymers comprise an organic polymer chain comprising as polymerized units one or more monomers of formula (1), one or more monomers of formula (3), and one or more monomers of formula (4), more preferably one or more monomers of formula (1), one or more monomers of formula (3) and one or more monomers of formula (5), and even more preferably one or more monomers of formula (1), one or more monomers of formula (3), and one or more monomers of formula (5a). When the present condensed polymer comprises an organic polymer chain comprising as polymerized units one or more monomers of formula (1), one or more monomers of formula (3), and one or more monomers of formula (4), the mole ratio of the total monomers of formulae (1) and (3) to the total monomers of formula (4) is from 99:1 to 1:99, preferably from 90:10 to 10:90, and more preferably from 75:25 to 25:75. It is preferred that the total moles of the monomers of formula (4) is greater than either of the total moles of the monomers of formula (1) or the total moles of the monomers of formula (3). When the present condensed polymers comprise as polymerized units a relatively higher percentage of monomers containing a chromophore, such condensed polymers show reduced ability to be removed by wet stripping. It is preferred that the present condensed polymers comprise an organic polymer chain comprising as polymerized units from 0 to 50 mol % of monomers containing a chromophore. It is further preferred that present condensed polymers comprise an organic polymer chain free of pendent aromatic rings having a substituent of the formula

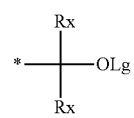

where each Rx is independently H or a alkyl group of 1 to 15 carbons, where each Rx may be taken together form an aliphatic ring; Lg is H, an aliphatic monovalent hydrocarbon having 1 to 10 carbons, or a monovalent aromatic group, and * indicates the point of attachment to the aromatic ring.

Any condensable silicon monomer may be used to form the present condensed polymers, provided that the condensable silicon monomer is different from the second unsaturated monomer having a condensable silicon moiety, and that the condensable silicon monomer condenses with the condensable silicon moiety pendent from the organic polymer backbone. As used herein, the term "backbone" refers to the main polymer chain. As used herein, "condensable silicon monomer" refers to a silicon monomer having one or more condensable or hydrolyzable moieties. As used herein, "condensable moiety" or "hydrolyzable moiety" refers to any moiety capable to being condensed or hydrolyzed under conditions used to form the present condensed polymers. Exemplary condensable or hydrolyzable moieties include, but are not limited to, halogens, alkoxy, carboxylate, hydroxy, enoxy, oximino, amino, and the like. Suitable condensable silicon monomers are those of formula (9)

$$\text{Si}(R^{50})_q(X)_{4-q} \quad (9)$$

wherein each $R^{50}$ is independently chosen from a $C_{1-30}$ hydrocarbyl moiety and a substituted $C_{1-30}$ hydrocarbyl moiety; each X is independently chosen from halogen, $C_{1-10}$ alkoxy, —OH, —O—C(O)—$R^{50}$, —(O—Si($R^{51}$)$_2$)$_{q2}$—$X^1$, and —(Si($R^{51}$)$_2$)$_{q3}$—$X^1$; $X^1$ is independently chosen from halogen, $C_{1-10}$ alkoxy, —OH, —O—C(O)—$R^{50}$; each $R^{51}$ is independently chosen from $R^{50}$ and X; q is an integer from 0 to 3; q2 is an integer from 1 to 10; and q3 is an integer from 1 to 10. Preferably, q is an integer from 0 to 2, more preferably 0 to 1, and yet more preferably q=0. X is preferably chosen from $C_{1-10}$ alkoxy, —OH, —O—C(O)—$R^{50}$, and —(O—Si($R^{51}$)$_2$)$_{q2}$—$X^1$, and more preferably from $C_{1-10}$ alkoxy and —OH. $X^1$ is preferably chosen from $C_{1-10}$ alkoxy and —OH. The substituted $C_{1-30}$ hydrocarbyl moiety of $R^{50}$ refers to any $C_{1-30}$ hydrocarbyl moiety having one or more of its hydrogens replaced with one or more substituted moieties chosen from hydroxy, mercapto, $C_{1-20}$ alkoxy, amino, $C_{1-20}$ alkylamino, di-$C_{1-20}$ alkylamino, cyano, halogen, epoxide, —C(=O)O—$R^{51}$, —C(=O)—N($R^{51}$)$_2$, and —C(=O)—O—C(=O)—$R^{51}$, wherein each $R^{51}$ is chosen from H and $C_{1-20}$ alkyl. Suitable $C_{1-30}$ hydrocarbyl moieties of $R^{50}$, without limitation, $C_{1-30}$ alkyl, $C_{2-30}$ alkenyl, $C_{2-30}$ alkynyl, $C_{3-30}$ cycloalkyl, and $C_{6-30}$ aryl, and preferably are $C_{1-20}$ alkyl, $C_{2-20}$ alkenyl, $C_{2-20}$ alkynyl, $C_{3-20}$ cycloalkyl, and $C_{6-25}$ aryl. Silicon monomers are often referred to by the number of hydrolyzable moieties bonded to silicon in the monomer. For example, "M monomer" refers to a silicon monomer having one hydrolyzable moiety, such as monomers of formula $(R^{50})_3$SiX, "D monomer" refers to a silicon monomer having two hydrolyzable moieties such as monomers of the formula $(R^{50})_2$SiX$_2$, "T monomer" refers to a silicon monomer having three hydrolyzable moieties such as monomers of the formula $R^{50}$SiX$_3$, and "Q monomer" refers to a to a silicon monomer having four hydrolyzable moieties such as monomers of the formula SiX$_4$, wherein X and $R^{50}$ in each monomer are as described above. Any of M, D, T and Q monomers may be used individually or a mixture of any of the foregoing may be used to prepare the present condensed polymers. Preferably, the condensable silicon monomer is one or more monomers chosen from formulas (9a), (9b), (9c), and (9d)

$$(R^{50})_3\text{SiX} \quad (9a)$$

$$(R^{50})_2\text{SiX}_2 \quad (9b)$$

$$R^{50}\text{SiX}_3 \quad (9c)$$

$$\text{SiX}_4 \quad (9d)$$

wherein each X and $R^{50}$ are as described above for formula (9). It is preferred that one or more Q monomers, that is, monomers of formula (9d), are used to prepare the present condensed polymers. Such condensable silicon monomers are generally commercially available and may be used as is or may be further purified.

Condensable silicon monomers useful in forming the present condensed polymers include, without limitation, methyltrichlorosilane, methyltrimethoxysilane, methyltriethoxysilane, methyltriacetoxysilane, ethyltrichlorosilane, ethyltrimethoxysilane, ethyltriethoxysilane, ethyltriacetoxysilane, propyltrichlorosilane, propyltrimethoxysilane, propyltriethoxysilane, propyltriacetoxysilane, hydroxypropyltrichlorosilane, hydroxypropyltrimethoxysilane, hydroxypropyltriethoxysilane, hydroxypropyltriacetoxysilane, mercaptopropyltrichlorosilane, mercaptopropyltrimethoxysilane, mercaptopropyltriethoxysilane, mercaptopropyltriacetoxy-silane, cyclopentyltrichlorosilane, cyclopentyltrimethoxysilane, cyclopentyltriethoxysilane, cyclopentyltriacetoxysilane, vinyltrichlorosilane, vinyltrimethoxysilane, vinyltriethoxysilane, vinyltriacetoxysilane, phenyltrichlorosilane, phenyltrimethoxysilane, phenyltriethoxysilane, phenyltriacetoxysilane, biphenyltrichlorosilane, biphenyltrimethoxysilane, biphenyltriethoxysilane, biphenyltriacetoxysilane, dimethyldichlorosilane, dimethyldimethoxysilane, dimethyldiethoxysilane, dimethyldiacetoxysilane, diethyldichlorosilane, diethyldimethoxysilane, diethyldiethoxysilane, diethyldiacetoxysilane, diphenyldichlorosilane, diphenyldimethyoxy-silane, diphenyldiethoxysilane, diphenyldiacetoxysilane, methylphenyldichlorosilane, methylphenyldimethoxysilane, methylphenyldiethoxysilane, methylphenyldiacetoxysilane, methylvinyldichlorosilane, methylvinyldimethoxysilane, methylvinyldiethoxysilane, methylvinyldiacetoxysilane, divinyldichlososilane, divinyldimethoxysilane, divinyldiethoxysilane, divinyldiacetoxysilane, tetrachlorosilane, tetramethoxysilane, tetraethoxysilane, and tetraacetoxysilane. Preferred curable silicon monomers are tetramethoxysilane and tetraethoxysilane.

Optionally, one or more etch selectivity improving agents may also be condensed with the one or more condensable silane monomers and the one or more polymers described above. Suitable etch selectivity improving agents are those of formula (10)

$$G(X^2)_{m4} \quad (10)$$

wherein, G is an element from Groups 13 to 15 of the periodic table excluding carbon and silicon; each $X^2$ is independently chosen from halogen, and $OR^{52}$; each $R^{52}$ is independently H or an organic group having 1 to 30 carbon atoms; and m4 is the valence of G. Preferably, $R^{52}$ is chosen from H, $C_{1-10}$-alkyl, —C(O)—$C_{1-10}$-alkyl, and $C_{6-10}$-aryl, and more preferably from H, $C_{1-10}$-alkyl, and —C(O)—$C_{1-10}$-alkyl. G is preferably an element chosen from boron, aluminum, gallium, yttrium, germanium, titanium, zirconium, hafnium, bismuth, tin, phosphorous, vanadium, arsenic, antimony, niobium, and tantalum, more preferably from boron, aluminum, and germanium, and even more preferably G is boron. Suitable compounds of formula (10) include, but are not limited to: trimethyl borate, triethyl borate, tripropyl borate, tributyl borate, tripentyl borate, trihexyl borate, tricyclopentyl borate, tricyclohexyl borate, triallyl borate, triphenyl borate, boron methoxyethoxide, boric acid, boron oxide; aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, aluminum 2,2,6,6-tetramethyl-3,5-heptanedionate, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, and germanium ethoxyethoxide. Suitable etch selectivity improving agents are those disclosed in U.S. Pat. No. 8,951,917, and may be available from Gelest, Inc. (Tullytown, Pa.).

Condensed polymers of the invention may be prepared by first polymerizing the one or more first unsaturated monomers, the one or more second unsaturated monomers, and any optional third unsaturated monomers according to methods well-known in the art to form an uncondensed organic polymer having pendent condensable silicon-containing moieties. Preferably, the present monomers are polymerized by free-radical polymerization, such as those procedures used for preparing (meth)acrylate or styrenic polymers. Any of a wide variety of free-radical initiators and conditions my be used. Other suitable polymerization methods of preparing the polymers include, without limitation, Diels-Alder, living anionic, condensation, cross-coupling, RAFT, ATRP, and the like. Next, one or more uncondensed organic polymers and one or more condensable silicon monomers are subjected to conditions to condense and/or hydrolyze the pendent condensable silicon-containing moiety with the silicon monomer to form the present condensed polymers. Such condensation and/or hydrolysis conditions are well-known in the art and typically involve contacting the one or more uncondensed organic polymers with aqueous acid or aqueous base, and preferably aqueous acid in the presence of the condensable silicon monomer. For example, one or more of the present uncondensed organic polymers and one or more condensable silicon monomers may be contacted with a composition comprising water, an acid, and optionally one or more organic solvents, with optional heating. Preferred acids are mineral acids, such as HCl. The condensed polymers of the invention may be partially condensed or fully condensed. By "partially condensed" it is meant that a portion of the condensable silicon-containing moieties pendent from the organic polymer chain have undergone a condensation or hydrolysis reaction. By "fully condensed" is meant that all condensable silicon-containing moieties pendent from the organic polymer chain have undergone a condensation or hydrolysis reaction. The present uncondensed organic polymers typically have a $M_w$ of 1000 to 10000 Da, preferably from 2000 to 8000 Da, and more preferably from 2500 to 6000 Da. The present condensed polymers typically have a $M_w$ of 5000 to 75000 Da, preferably from 10000 to 50000 Da, and more preferably from 20000 to 40000 Da. It will be appreciated by those skilled in the art that mixtures of condensed polymers may suitably be used in the present process.

Compositions of the present invention comprise: (a) one or more solvents; and (b) a condensate and/or hydrolyzate of (i) one or more polymers comprising as polymerized units one or more first unsaturated monomers having a moiety having an acidic proton and a pKa in water from −5 to 13 and one or more second unsaturated monomers having a condensable silicon-containing moiety, wherein the condensable silicon-containing moiety is pendent to the polymer backbone, and (ii) one or more condensable silicon monomers. Alternatively, the compositions of the invention comprise: (a) one or more solvents; and (b) one or more condensed polymers having an organic polymer chain having pendently-bound moieties having an acidic proton and a pKa in water from −5 to 13 and having pendently-bound siloxane moieties. The compositions of the invention are free of separate siloxane oligomers and/or polymers, that is, the compositions are free of siloxanes that are not pendently-bound to the polymer chain of the present condensed polymers. In other words, the only siloxanes present in the compositions of the invention are pendently-bound to the polymer chain of the condensed polymer.

Preferred compositions comprise: (1) one or more condensates and/or hydrolyzates of one or more polymers comprising as polymerized units (i) one or more first unsaturated monomers having a moiety having an acidic proton and a pKa in water from −5 to 13, (ii) one or more second unsaturated monomers having a condensable silicon-containing moiety wherein the condensable silicon-containing moiety is pendent to the polymer backbone, (iii) one or more third unsaturated monomers, the third unsaturated monomers being different from each of the first and second unsaturated monomers, that is, the third unsaturated monomers are free of a condensable silicon-containing moiety and free of an acidic moiety having an acidic proton and a pKa in water from −5 to 13, and (iv) one or more condensable silicon monomers; and (2) one or more solvents. More preferably, the present compositions comprise: (1) one or more condensates and/or hydrolyzates of one or more polymers comprising as polymerized units (i) one or more first unsaturated monomers having a moiety having an acidic proton and a pKa in water from −5 to 13, (ii) one or more second unsaturated monomers having a condensable silicon-containing moiety wherein the condensable silicon-containing moiety is pendent to the polymer backbone, (iii) one or more third unsaturated monomers having one or more moieties chosen from an acid decomposable group, a monovalent organic residue having a lactone moiety, a chromophore moiety, and a combination thereof, and (iv) one or more condensable silicon monomers; and (2) one or more solvents. Alternatively, preferred compositions of the invention comprise: (1) one or more condensed polymers having an organic polymer chain having (a) pendently-bound moieties having an acidic proton and a pKa in water from −5 to 13, (b) pendently-bound siloxane moieties, and (c) pendently-bound moieties chosen from an acid decomposable group, a monovalent organic residue having a lactone moiety, a chromophore moiety, and a combination thereof; and (2) one or more solvents.

Preferably, the organic polymer chain of the one or more condensates and/or hydrolyzates of the invention comprises as polymerized units at least one additional unsaturated monomer of the formula (5)

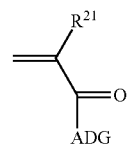

(5)

wherein ADG is an acid decomposable group; and $R^{21}$ is chosen from H, $C_{1-4}$-alkyl, $C_{1-4}$-haloalkyl, halogen, and CN. When the compositions of the invention are used as underlayers, it is preferred that the organic polymer chain of the one or more of the condensed polymers comprises one or more chromophore moieties, and more preferably that at least one chromophore moiety is pendent from the polymer backbone. Suitable chromophores are aryl moieties are those discussed above. The choice of such chromophore depends upon the antireflective properties desired and is within the ability of those skilled in the art.

A variety of organic solvents and water may be used in the present compositions, provided that such solvent dissolves the components of the composition. Preferably, the present compositions comprise one or more organic solvents and optionally water. Organic solvents may be used alone or a mixture of organic solvents may be used. Suitable organic solvents include, but are not limited to; ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol methyl ether (PGME), propylene glycol ethyl ether (PGEE), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate (EL), methyl hydroxyisobutyrate (HBM), ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as gamma-butyrolactone; and any combination of the foregoing. Preferred solvents are PGME, PGEE, PGMEA, EL, HBM, and combinations thereof.

The present compositions may comprise one or more optional components, such as cure catalysts, coating enhancers, one or more stabilizers, and the like. The amount of such optional components used in the present compositions is well within the ability of those skilled in the art.

Suitable cure catalysts include, but are not limited to, thermal acid generators, photoacid generators, and quaternary ammonium salts, preferably thermal acid generators and quaternary ammonium salts, and more preferably quaternary ammonium salts. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids like amine blocked dodecylbenzenesulfonic acid. A wide variety of photoacid generators are known in the art and are also generally commercially available, such as from Wako Pure Chemical Industries, Ltd., and from BASF SE. Suitable quaternary ammonium salts are: quaternary ammonium halides; quaternary ammonium carboxylates; quaternary ammonium sulfonates; quaternary ammonium bisulfates; and the like. Preferred quaternary ammonium salts include; benzyltrialkylammonium halides such as benzyltrimethylammonium chloride and benzyltriethylammonium chloride; tetraalkylammonium halides such as tetramethylammonium halides, tetraethylammonium halides, and tetrabutylammonium halides; tetraalkylammonium carboxylates such as tetramethylammonium formate, tetramethylammonium acetate, tetramethylammonium triflate, tetrabutylammonium acetate, and tetrabutylammonium triflate; tetraalkylammonium sulfonates such as tetramethylammonium sulfonate and tetrabutylammonium sulfonate; and the like. Preferred cure catalysts are tetraalkylammonium halides, and more preferably tetraalkylammonium chlorides. Such quaternary ammonium salts are generally commercially available, such as from Sigma-Aldrich, or may be prepared by procedures known in the art. Such optional curing catalysts are used in the present compositions in an amount of from 0 to 10% of total solids, preferably from 0.01 to 7% of total solids, and more preferably from 0.05 to 5% of total solids.

Coating enhancers are optionally added to the present compositions to improve the quality of a film or layer of the composition that is coated on a substrate. Such coating enhancers may function as plasticizers, surface leveling agents, and the like. Such coating enhancers are well-known to those skilled in the art, and are generally commercially available. Exemplary coating enhancers are: relatively long chain alkanols such as octanol, decanol, oleyl alcohol, cetyl alcohol, and the like; glycols such as tripropylene glycol, tetraethylene glycol, and the like; and surfactants. While any suitable surfactant may be used as a coating enhancer, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. It is preferred that one or more coating enhancers are used in the present compositions. The coating enhancers are typically used in the present compositions in an amount of 0 to 10% based on the weight of solvent, preferably from 0.01 to 5 wt %, and more preferably from 0.02 to 2 wt %.

One or more stabilizers may optionally be added to the present compositions. Such stabilizers are useful for preventing unwanted hydrolysis or condensation of the silicon-containing moieties during storage. A variety of such stabilizers are known, and preferably the silicon-containing polymer stabilizer is an acid. Suitable acid stabilizers for the siloxane polymers include, without limitation, carboxylic acids, carboxylic acid anhydrides, mineral acids, and the like. Exemplary stabilizers include acetic acid, oxalic acid, malonic acid, malonic anhydride, malic acid, maleic acid, maleic anhydride, fumaric acid, citraconic acid, glutaric acid, glutaric anhydride, adipic acid, succinic acid, succinic anhydride, and nitric acid. Such stabilizers are used in an amount of 0 to 20% of total solids, preferably from 0.1 to 15% of total solids, more preferably from 0.5 to 10% of total solids, and yet more preferably from 1 to 10% of total solids.

The compositions of the invention are prepared by combining the one or more present condensed polymers; one or more solvents; and any optional components, in any order. The compositions may be used as is, or may be further purified, such as by filtration.

The process of the present invention comprises (a) coating a substrate with a composition comprising (1) one or more solvents; and (2) a condensate and/or hydrolyzate of (i) one or more polymers comprising as polymerized units one or more first unsaturated monomers having a moiety having an acidic proton and a pKa in water from −5 to 13 and one or more second unsaturated monomers having a condensable silicon-containing moiety, wherein the condensable silicon-containing moiety is pendent to the polymer backbone, and (ii) one or more condensable silicon monomers, to form a coating layer; (b) curing the coating layer to form a polymeric underlayer; (c) disposing a layer of a photoresist on the polymeric underlayer; (d) pattern-wise exposing the photoresist layer to form a latent image; (e) developing the latent image to form a patterned photoresist layer having a relief image therein; (f) transferring the relief image to the substrate; and (g) removing the polymeric underlayer by wet stripping. Alternatively, the present process of the present invention comprises (a) coating a substrate with a composition comprising (1) one or more solvents; and (2) one or more condensed polymers having an organic polymer chain having pendently-bound moieties having an acidic proton and a pKa in water from −5 to 13 and having pendently-bound siloxane moieties to form a coating layer; (b) curing the coating layer to form a polymeric underlayer; (c) disposing a layer of a photoresist on the polymeric underlayer;

(d) pattern-wise exposing the photoresist layer to form a latent image; (e) developing the latent image to form a patterned photoresist layer having a relief image therein; (f) transferring the relief image to the substrate; and (g) removing the polymeric underlayer by wet stripping.

A coating layer comprising the present compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the condensed polymer on the substrate. It will be appreciated by those skilled in the art that the thickness of the condensed polymer mixture layer may be adjusted by changing the spin speed, as well as the solids content of the composition.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

After being coated on the substrate, the coating layer is optionally soft-baked at a relatively low temperature to remove any solvent and other relatively volatile components from the underlayer. Typically, the substrate is baked at a temperature of ≤200° C., preferably from 100 to 200° C., and more preferably from 100 to 150° C. The baking time is typically from 10 seconds to 10 minutes, preferably from 30 seconds to 5 minutes, and more preferably from 60 to 90 seconds. When the substrate is a wafer, such baking step may be performed by heating the wafer on a hot plate. Such soft-baking step may be performed as part of the curing of the coating layer, or may be omitted altogether.

The coating layer comprising the present condensed polymers is then cured to form an underlayer. The coating layer is sufficiently cured such that the film does not intermix with a subsequently applied organic layer, such as a photoresist or other organic layer disposed directly on the coating layer, while still maintaining the desired antireflective properties (n and k values) and etch selectivity of the underlayer film. The coating layer may be cured in an oxygen-containing atmosphere, such as air, or in an inert atmosphere, such as nitrogen and under conditions, such as heating, sufficient to provide a cured underlayer. This curing step is conducted preferably on a hot plate-style apparatus, although oven curing may be used to obtain equivalent results. Typically, such curing is performed by heating the condensed polymer layer at a curing temperature of ≤350° C., and preferably 200 to 250° C. Alternatively, a two-step curing process or a ramped temperature curing process may be used. Such two-step and ramped temperature curing conditions are well-known to those skilled in the art. The curing temperature selected should be sufficient for any thermal acid generator used to liberate acid to aid in curing of the condensed polymer film. The curing time may be from 10 seconds to 10 minutes, preferably from 30 seconds to 5 minutes, more preferably from 45 seconds to 5 minutes, and yet more preferably from 45 to 90 seconds. The choice of final curing temperature depends mainly upon the desired curing rate, with higher curing temperatures requiring shorter curing times. Following this curing step, the underlayer surface may optionally be passivated by treatment with a passivating agent such as a disilazane compound, such as hexamethyldisilazane, or by a dehydration bake step to remove any adsorbed water. Such passivating treatment with a disilazane compound is typically performed at 120° C.

After curing of the coating layer comprising the condensed polymer to form an underlayer, one or more processing layers, such as photoresists, hardmask layers, bottom antireflective coating (or BARC) layers, and the like, may be disposed on the underlayer. For example, a photoresist layer may be disposed, such as by spin coating, directly on the surface of the underlayer. Alternatively, a BARC layer may be coated directly on the underlayer, followed by curing of the BARC layer, and coating a photoresist layer directly on the cured BARC layer. In another alternative, an organic underlayer is first coated on a substrate and cured, a condensed polymer layer of the invention is then coated on the cured organic underlayer, the coating layer is then cured to form an underlayer, an optional BARC layer may be coated directly on the underlayer, followed by curing of the optional BARC layer, and coating a photoresist layer directly on the cured BARC layer. A wide variety of photoresists may be suitably used, such as those used in 193 nm lithography, such as those sold under the EPIC™ brand available from Dow Electronic Materials (Marlborough, Mass.). Suitable photoresists may be either positive tone development or negative tone development resists, or may be conventional negative resists. The photoresist layer is then imaged (exposed) using patterned actinic radiation, and the exposed photoresist layer is then developed using the appropriate developer to provide a patterned photoresist layer. The pattern is next transferred from the photoresist layer to any optional BARC layer, and then to the underlayer by an appropriate etching technique, such as dry etching with an appropriate plasma. Typically, the photoresist is also removed during such etching step. Next, the pattern is transferred to any organic underlayer present using an appropriate technique, such as dry etching with $O_2$ plasma, and then to the substrate as appropriate. Following these pattern transfer steps, the underlayer, and any optional organic underlayers are removed using conventional techniques. The electronic device substrate is then further processed according to conventional means.

The present compositions provide underlayers having good etch resistance and high silicon content (≤45% Si, and preferably from 0.5 to 30% Si). The coating layers comprising the present condensed polymers and underlayers described herein are wet strippable. By "wet strippable" is meant that the coating layers and underlayers of the invention are removed, and preferably substantially removed (≥95% of film thickness), by contacting the coating layer or underlayer with conventional wet stripping compositions, such as: (1) an aqueous base composition, such as aqueous alkali (typically about 5%) or aqueous tetramethylammonium hydroxide (typically ≥5 wt %), (2) aqueous fluoride ion strippers such as ammonium fluoride/ammonium bifluoride mixtures, (3) a mixture of mineral acid, such as sulfuric acid or hydrochloric acid, and hydrogen peroxide such as a mixture of concentrated sulfuric acid+30% hydrogen peroxide, or (4) a mixture of ammonia, water and optionally hydrogen peroxide. A particular advantage of the present polymers, and particularly of the present underlayers, is that they are wet strippable upon contact with a mixture of ammonia and hydrogen peroxide. A wide range of ammonia and water mixtures may be used. A suitable mixture of ammonia, water and hydrogen peroxide is a mixture of ammonia+hydrogen peroxide+water in a weight ratio of 1:1:5 to 1:10:50, such as ratios of 1:1:10, 1:1:40, 1:5:40, 1:1:50, or 1:8:50. Preferably, ≥97%, and more preferably ≥99%, of the film thickness of the polymer layer or underlayer is removed by contacting the polymer layer or siloxane underlayer with either (i) mixture of sulfuric acid and hydrogen peroxide or (ii) a mixture of ammonium hydroxide and hydrogen peroxide. Such wet stripping of the present underlayers may be performed at any suitable temperature. A particular advantage of the present compositions, and particularly of the present underlayers, is that they are wet strippable at lower temperatures, such as from 20 to 30° C., preferably from 22 to 28° C., and more preferably 25° C.

Another advantage of the present polymer layers is that they are easily removed to allow re-work of the substrate, such as a wafer. In such a re-work process, a composition described above comprising one or more condensed polymers of the invention is coated on a substrate. The coated polymer layer is then optionally soft-baked, and then cured to form an underlayer. Next, a photoresist layer is coated on the underlayer, and the resist layer is imaged and developed. The patterned resist layer and the underlayer may then each be removed to allow the wafer to be re-worked. The underlayer is contacted with any of the above-described wet stripping compositions, such as aqueous tetramethylammonium hydroxide compositions (typically ≥5 wt %) and aqueous fluoride ion strippers such as ammonium fluoride/ammonium bifluoride mixtures, at a suitable temperature to remove the underlayer to provide the substrate free, or substantially free, of underlayer and readily undergo additional re-work as may be necessary. Such re-work includes coating another layer of the present condensed polymers on the substrate and processing the polymer coating as described above.

A further advantage provided by the invention is a silicon-containing underlayer on a substrate, the silicon-containing underlayer comprising one or more condensed polymers having an organic polymer chain having pendently-bound moieties having an acidic proton and a pKa in water from −5 to 13 and having pendently-bound siloxane moieties, wherein the silicon-containing underlayer has a removal rate of greater than 100 Å/sec. when contacted with a mixture of 30% $NH_4OH$/30% $H_2O_2$/water in a ratio of 1/1/5 to 1/8/50 wt/wt/wt for a period of time from 30 seconds to 5 minutes at temperature in the range of from room temperature to 70° C. Preferably, such silicon-containing underlayers have a removal rate of at least 125, more preferably at least 150, yet more preferably at least 200, and even more preferably at least 250 Å/sec. Preferably, the polymers comprise as polymerized units one or more second unsaturated monomers as described above.

EXAMPLE 1

A solution of tert-butyl methacrylate (tBMA), (59.99 g), methacrylic acid (MAA), (29.06 g) and 3-(trimethoxysilyl) propyl methacrylate (TMSPMA), (20.95 g) dissolved in 1,3-dioxolane (85.4 g) and a solution of V-65 initiator (20.95 g) dissolved in 2:1 v/v tetrahydrofurane/acetonitrile (20.9 g) were both added dropwise over 2 hours to 1,3-dioxolane (199 g) at 75° C. under a nitrogen blanket. After addition, the reaction mixture was held at 75° C. for an additional two hours, cooled to room temperature and precipitated into heptanes (3.8 L). The precipitated polymer was collected by vacuum filtration and vacuum oven dried for 24 hours to afford Polymer 1 (tBMA/MAA/TMSPMA 50/40/10) as a white solid (99 g, 90%). $M_w$ was determined by GPC relative to polystyrene standards and was found to be 7828 Da.

EXAMPLE 2

A solution of hydrochloric acid (37 wt % in water, 2.93 g) in water (9.8 g) was added over 10 minutes to a mixture of tetraethyl orthosilicate (TEOS) (23.97 g, 50 mol %) and Polymer 1 from Example 1 (15.0 g, 50 mol %) in tetrahydrofuran (THF) (81 g) and stirred at room temperature for 1 hour. The reaction mixture was heated to 63° C. for 4 hours and then cooled to room temperature. PGEE (107 g) was added, the volatile species removed under reduced pressure, and the resulting solution was diluted with PGEE to deliver Condensed Polymer 1 (10 wt % in PGEE, 213 g) as a clear solution. $M_w$ was determined by GPC relative to polystyrene standards and was found to be 29,300 Da.

EXAMPLE 3

A solution of hydrochloric acid (37 wt % in water, 0.92 g) in water (3.06 g) was added over 10 minutes to a mixture of TEOS (6.85 g, 30 mol %) and Polymer 1 from Example 1 (10.0 g, 70 mol %) in THF (39 g) and stirred at room temperature for 1 hour. The reaction mixture was heated to 63° C. for 6 hours and then cooled to room temperature. PGEE (52 g) was added, the volatile species removed under reduced pressure, and the resulting solution was diluted with PGEE to deliver Condensed Polymer 2 (10 wt % in PGEE, 125 g) as a clear solution. $M_w$ was determined by GPC relative to polystyrene standards and was found to be 35,000 Da.

EXAMPLE 4

A solution of hydrochloric acid (37 wt % in water, 6.56 g) in water (21.9 g) was added over 10 minutes to a mixture of TEOS (55.93 g, 70 mol %) and Polymer 1 from Example 1 (15.0 g, 30 mol %) in THF (81 g) and stirred at room temperature for 1 hour. The reaction mixture was heated to 63° C. for 6 hours and then cooled to room temperature. PGEE (107 g) was added, the volatile species removed under reduced pressure, and the resulting solution was diluted with PGEE to deliver Condensed Polymer 3 (10 wt % in PGEE, 342 g) as a clear solution. $M_w$ was determined by GPC relative to polystyrene standards and was found to be 27,000 Da.

EXAMPLE 5

A solution of hydrochloric acid (37 wt % in water, 1.08 g) in water (3.61 g) was added over 10 minutes to a mixture of TEOS (7.38 g, 30 mol %), phenyltrimethoxysilane (PTMS) (1.17 g, 5 mol %) and Polymer 1 from Example 1 (10.0 g, 65 mol %) in THF (40.5 g) and stirred at room temperature for 1 hour. The reaction mixture was heated to 63° C. for 6 hours and then cooled to room temperature. PGEE (55 g) was added, the volatile species removed under reduced pressure, and the resulting solution was diluted with PGEE to deliver Condensed Polymer 4 (10 wt % in PGEE, 121 g) as a clear solution. $M_w$ was determined by GPC relative to polystyrene standards and was found to be 21,000 Da.

COMPARATIVE EXAMPLE 1

A solution of tert-butyl methacrylate (tBMA), (173 g), gamma butyrolactone (GBLMA), (166 g) and 3-(trimethoxysilyl)propyl methacrylate (TMSPMA), (60.6 g) dissolved in 1,3-dioxolane (304 g) and a solution of V-65 initiator (60.6 g) dissolved in 2:1 v/v tetrahydrofurane/acetonitrile (60.6 g) were both added dropwise over 2 hours to 3-dioxolane (710 g) at 75° C. under a nitrogen blanket. After addition the reaction solution was held at 75° C. for an additional two hours, cooled to room temperature and precipitated into heptanes:methyl tert-butyl ether (MTBE) (1:1 v/v, 14 L). The precipitated polymer was collected by vacuum filtration and vacuum oven dried for 24 hours to afford Comparative Polymer 1 (tBMA/GBLMA/TMSPMA 50/40/10) as a white solid (271 g, 68%). $M_w$ was determined by GPC relative to polystyrene standard and was found to be 5700 Da.

EXAMPLE 7

Formulations were prepared by combining: 1.60 wt % of the condensed polymer indicated in Table 1; 0.004 wt % of a 0.1 wt % solution of tetrabutylammonium chloride in PGEE; 48.95 wt % of PGEE; 49.15 wt % of 2-hydroxyisobutyric acid methyl ester; 0.009 wt % of malonic acid; 0.085 wt % of acetic acid; and 0.2 wt % of a long chain alcohol coating enhancer. Each formulation was filtered through 0.2 m polytetrafluoroethylene syringe.

TABLE 1

| Condensed Polymer | Formulation Sample |
| --- | --- |
| Comparative Polymer 1 | Comparative Formulation 1 |
| Condensed Polymer 1 | Formulation 1 |
| Condensed Polymer 2 | Formulation 2 |
| Condensed Polymer 3 | Formulation 3 |
| Condensed Polymer 4 | Formulation 4 |

EXAMPLE 8

Formulations from Example 7 were spin-coated on a bare 200 mm silicon wafers at 1500 rpm and baked at 240° C. for 60 seconds using an ACT-8 Clean Track (Tokyo Electron Co.). The thickness of each coated film after baking was measured with an OptiProbe™ instrument from Thermawave Co. Each coated sample was then evaluated for SC-1 wet strippability using an SC-1 solution of 1/8/50 wt/wt/wt mixture of 30% $NH_4OH$/30% $H_2O_2$/water. The SC-1 solution was heated to 25° C., and coupons of each coated wafer were immersed into the solution for 1 min. The coupons were removed from the SC-1 solution and rinsed with deionized water, and the film thickness was again measured. The film thickness loss for each sample was calculated as the difference in film thickness before and after contact with the SC-1 solution. A separate film prepared as described above was optionally tested for SC-1 strippability after etching. Etching was performed for 60 seconds using RIE790 from Plasma-Therm Co. with oxygen gas, 25 sccm flow, 180 W of power, and 6 mTorr of pressure. The stripping results, obtained as the rate of film removal in Å/min, are reported in Table 1.

Formulation samples from Example 7, at either 1.7% or 3.5% solids, were coated on 200 mm silicon wafers as described above with a target thickness of 400 Å or 1000 Å and measured (post cure) as described above. A puddle of commercially available 0.26N TMAH developer (MF CD-26) was applied to each wafer for 60 seconds, after which the wafers were rinsed with DI water, spin dried and the film thickness was re-measured. A final drying bake of 105° C./60 seconds was applied to each wafer and final film thickness was measured. The thickness loss of each film, reported as the rate of film removal in Å/min, resulting from this TMAH strip is reported in Table 2. A negative film strip value indicates an increase in film thickness.

TABLE 2

| Formulation Example | Before Etch (Å/min) | After Etch (Å/min) | TMAH Strip (Å/min) |
| --- | --- | --- | --- |
| Comparative Formulation 1 | 15 | 47 | −14 |
| Formulation 1 | 104 | 78 | 6 |
| Formulation 2 | 361 | 225 | 19 |
| Formulation 3 | 171 | 45 | 7 |
| Formulation 4 | 169 | 33 | — |

What is claimed is:

1. A composition comprising: (a) one or more solvents; and (b) a condensate and/or hydrolyzate of (i) one or more organic polymers comprising as polymerized units: one or more first unsaturated monomers having a moiety having an acidic proton and a pKa in water from −5 to 13; one or more second unsaturated monomers having a condensable silicon-containing moiety, wherein the condensable silicon-containing moiety is pendent to the organic polymer backbone; one or more third unsaturated monomers free of an acidic moiety having an acidic proton and having a pKa in water of −5 to 13, and free of a condensable silicon-containing moiety, wherein at least one third monomer has the formula (5)

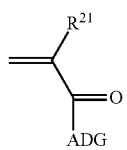

wherein ADG is an acid decomposable group; and $R^{21}$ is H, $C_{1-4}$-alkyl, $C_{1-4}$-haloalkyl, halogen, or CN; and one or more unsaturated monomers having a chromophore moiety, and (ii) one or more condensable silicon monomers.

2. The composition of claim 1 wherein at least one first unsaturated monomer has an acidic moiety selected from the group consisting of carboxylic acid, sulfonic acid, sulfinic acid, sulfamic acid, boronic acid, phosphoric acid, and combinations and acid salts thereof, a hydroxyaryl group, an unsubstituted imide group, a mercapto group, and a $C_{1-20}$-hydroxyl-substituted haloalkyl group.

3. The composition of claim 1 wherein at least one first unsaturated monomer has the formula (1)

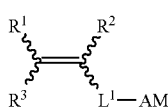

(1)

wherein $L^1$ is a single bond or a divalent linking group; AM is an acidic moiety having an acidic proton and having a pKa in water from −5 to 13; each of $R^1$ and $R^2$ is independently H, $C_{1-4}$-alkyl, $C_{1-4}$-haloalkyl, optionally substituted $C_{6-20}$-aryl, halogen, or CN; $R^3$ is H, $C_{1-10}$-alkyl, $C_{1-10}$-haloalkyl, optionally substituted $C_{6-20}$-aryl, halogen, or —C(=O)$R^4$; $R^4$ is O$R^5$ or N($R^6$)$_2$; $R^5$ is H, $C_{1-20}$-alkyl, $C_{5-30}$-aryl, $C_{6-20}$-aralkyl or a monovalent organic residue having a lactone moiety; and each $R^6$ is independently H, $C_{1-20}$-alkyl, or $C_{6-20}$-aryl; wherein any two of $L^1$, $R^1$, $R^2$ and $R^3$ may be taken together with the carbons to which they are attached to form a 5 to 7-membered ring.

4. The composition of claim 3 wherein $L^1$ is a single covalent bond or a divalent organic radical having from 1 to 20 carbon atoms and optionally one or more heteroatoms.

5. The composition of claim 1 wherein the condensable silicon-containing moiety has the formula (2)

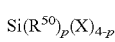

(2)

wherein $L^2$ is a single bond or a divalent linking group; each $R^7$ is independently H, $C_{1-10}$-alkyl, $C_{2-20}$-alkenyl, $C_{5-20}$-aryl, or $C_{6-20}$-aralkyl; each $Y^1$ is independently halogen, $C_{1-10}$-alkoxy, $C_{5-10}$-aryloxy, or $C_{1-10}$-carboxy; b is an integer from 0 to 2; and * denotes the point of attachment to the monomer.

6. The composition of claim 1 wherein at least one second unsaturated monomer has the formula (3)

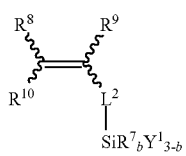

(3)

wherein $L^2$ is a single bond or a divalent linking group; each $R^7$ is independently H, $C_{1-10}$-alkyl, $C_{2-20}$-alkenyl, $C_{5-20}$-aryl, or $C_{6-20}$-aralkyl; each of $R^8$ and $R^9$ is independently H, $C_{1-4}$-alkyl, $C_{1-4}$-haloalkyl, halogen, $C_{5-20}$-aryl, $C_{6-20}$-aralkyl, or CN; $R^{10}$ is H, $C_{1-10}$-alkyl, $C_{1-10}$-haloalkyl, halogen, $C_{5-20}$-aryl, $C_{6-20}$-aralkyl, or C(=O)$R^{11}$; $R^{11}$ is O$R^{12}$ or N($R^{13}$)$_2$; $R^{12}$ is H, $C_{1-20}$-alkyl, $C_{5-20}$-aryl, or $C_{6-20}$-aralkyl; each $R^{13}$ is independently H, $C_{1-20}$-alkyl, or $C_{5-20}$-aryl; each $Y^1$ is independently halogen, $C_{1-10}$-alkoxy, $C_{5-10}$-aryloxy, or $C_{1-10}$-carboxy; and b is an integer from 0 to 2.

7. The composition of claim 6 wherein $L^2$ is a divalent organic radical having from 1 to 20 carbon atoms and optionally one or more heteroatoms.

8. The composition of claim 6 wherein the divalent linking group has the formula —C(=O)—O-$L^3$- wherein $L^3$ is a single bond or an organic radical having from 1 to 20 carbon atoms.

9. The composition of claim 1 wherein the chromophore moiety is pendent from the organic polymer backbone.

10. The composition of claim 9 wherein the chromophore moiety is selected from the group consisting of from furyl, pyryl, thiophenyl, pyridyl, phenyl, naphthyl, acenaphthyl, fluorenyl, carbazolyl, anthracenyl, phenanthryl, pyrenyl, coronenyl, tetracenyl, pentacenyl, tetraphenyl, benzotetracenyl, triphenylenyl, perylenyl, benzyl, phenethyl, tolyl, xylyl, styrenyl, vinylnaphthyl, vinylanthracenyl, dibenzothiophenyl, thioxanthonyl, indolyl, and acridinyl.

11. The composition of claim 1 wherein at least one condensable silicon monomer has the formula (9)

$$Si(R^{50})_p(X)_{4-p} \qquad (9)$$

wherein each $R^{50}$ is independently a $C_{1-30}$ hydrocarbyl moiety or a substituted $C_{1-30}$ hydrocarbyl moiety; and each X is independently halogen, $C_{1-10}$ alkoxy, —OH, —O—C(O)—$R^{50}$, —(O—Si($R^{51}$)$_2$)$_{p2}$—$X^1$, or —(Si($R^{51}$)$_2$)$_{p3}$—$X^1$; $X^1$ is independently halogen, $C_{1-10}$ alkoxy, —OH, or —O—C(O)—$R^{50}$; each $R^{51}$ is independently $R^{50}$ or X; p is an integer from 0 to 3; p2 is an integer from 1 to 10; and p3 is an integer from 1 to 10.

12. The composition of claim 11 wherein p=0 or 1.

13. A method comprising (a) coating a substrate with a composition to form a coating layer, wherein the composition comprises: (1) one or more solvents; and (2) a condensate and/or hydrolyzate of (i) one or more organic polymers comprising as polymerized units: one or more first unsaturated monomers having a moiety having an acidic proton and a pKa in water from −5 to 13; one or more second unsaturated monomers having a condensable silicon-containing moiety, wherein the condensable silicon-containing moiety is pendent to the organic polymer backbone; and one or more third unsaturated monomers free of an acidic moiety having an acidic proton and having a pKa in water of −5 to 13, and free of a condensable silicon-containing moiety, wherein at least one third monomer has the formula (5)

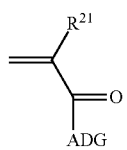

(5)

wherein ADG is an acid decomposable group; and $R^{21}$ is H, $C_{1-4}$-alkyl, $C_{1-4}$-haloalkyl, halogen, or CN, and (ii) one or more condensable silicon monomers; (b) curing the coating layer to form a polymeric underlayer; (c) disposing a layer of a photoresist on the polymeric underlayer; (d) pattern-wise exposing the photoresist layer to form a latent image; (e) developing the latent image to form a patterned photoresist layer having a relief image therein; (0 transferring the relief image to the substrate; and (g) removing the polymeric underlayer by wet stripping.

14. The method of claim 13 wherein the organic polymer further comprises as polymerized units one or more unsaturated monomers having a chromophore moiety.

15. The method of claim 13 wherein the polymeric underlayer is removed by wet stripping at room temperature.

* * * * *